United States Patent
Song et al.

(10) Patent No.: US 8,255,782 B2
(45) Date of Patent: Aug. 28, 2012

(54) METHOD FOR CONSTRUCTING LDPC CODE IN THE MOBILE DIGITAL MULTIMEDIA BROADCAST SYSTEM

(75) Inventors: Huishi Song, Beijing (CN); Hongbing Shen, Beijing (CN); Qun Li, Beijing (CN); Qinghua Yang, Beijing (CN); Wen Chen, Beijing (CN)

(73) Assignee: TIMI Technologies Co., Ltd., Beijing (CN)

( * ) Notice: Subject to any disclaimer, the term of this patent is extended or adjusted under 35 U.S.C. 154(b) by 823 days.

(21) Appl. No.: 12/376,644

(22) PCT Filed: Nov. 13, 2006

(86) PCT No.: PCT/CN2006/003036
§ 371 (c)(1),
(2), (4) Date: Feb. 6, 2009

(87) PCT Pub. No.: WO2008/019537
PCT Pub. Date: Feb. 21, 2008

(65) Prior Publication Data
US 2010/0180175 A1    Jul. 15, 2010

(30) Foreign Application Priority Data
Aug. 7, 2006    (CN) .......................... 2006 1 0089158

(51) Int. Cl.
G06F 11/00    (2006.01)

(52) U.S. Cl. ...................................................... 714/801
(58) Field of Classification Search ........... 714/800–801
See application file for complete search history.

(56) References Cited

U.S. PATENT DOCUMENTS
7,661,037 B2 * 2/2010 Niu et al. ...................... 714/701
2006/0156179 A1 7/2006 Shen et al.

FOREIGN PATENT DOCUMENTS
| CN | 1731684 | 2/2006 |
| EP | 1528686 | 5/2005 |
| WO | WO2006020460 | 2/2006 |

OTHER PUBLICATIONS

Hocevar, LDPC construction with flexible hardware implementation, 2003, IEEE, p. 2708-2712.*

* cited by examiner

*Primary Examiner* — Shelly A Chase

(57) ABSTRACT

A method for constructing LDPC (Low-Density Parity-Check) code in the mobile digital multimedia broadcast system is provided, wherein the Low-Density Parity-Check matrix of the LDPC code is iteratively constructed according to a code-table and expansion method, and the code-table is a part of the constructed Low-Density Parity-Check matrix. According to the constructing method of the present invention, the LDPC code having excellent performance of error correcting coding which is applicable to the mobile digital multimedia broadcast system.

13 Claims, 1 Drawing Sheet

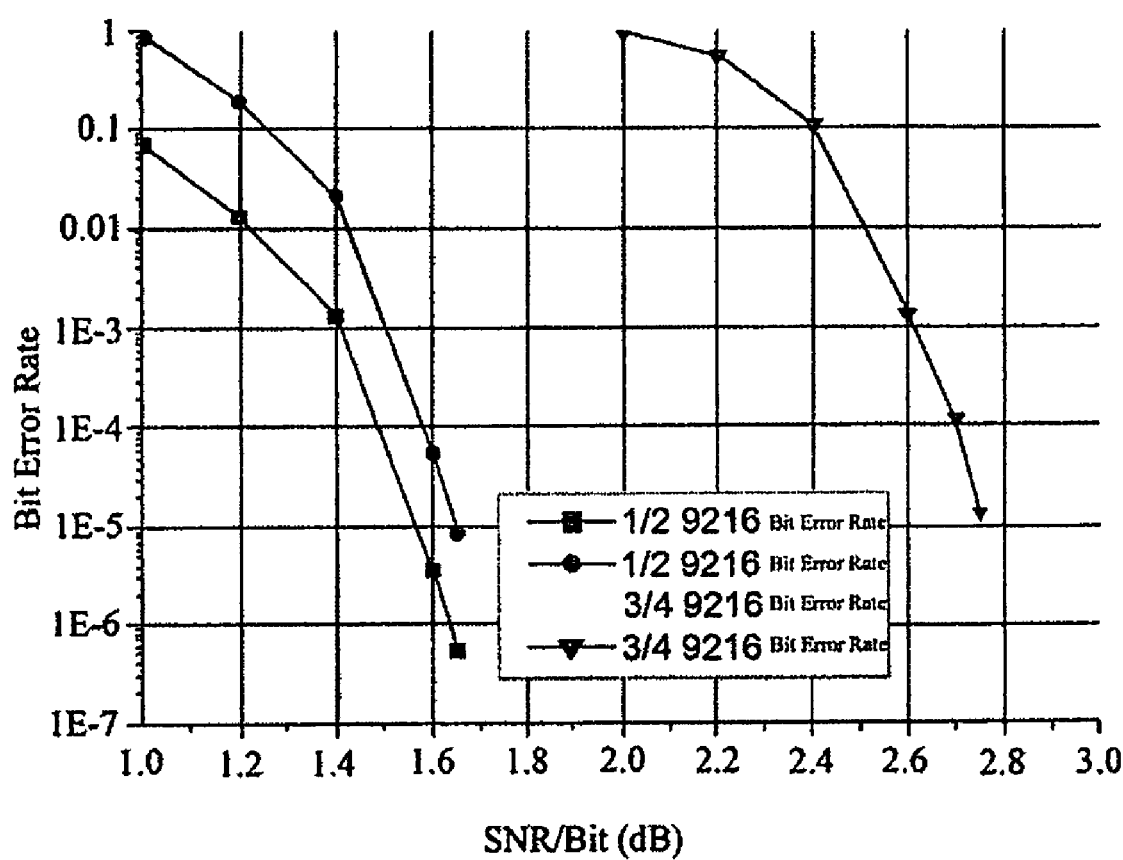

METHOD FOR CONSTRUCTING LDPC CODE IN THE MOBILE DIGITAL MULTIMEDIA BROADCAST SYSTEM

TECHNICAL FIELD

The present invention relates to a mobile digital multimedia broadcast communication system, and more particularly, to a method for constructing LDPC code in the mobile digital multimedia broadcast communication system.

BACKGROUND

In 1948, Claude Shannon initially proposed his famous "noisy channel encoding theory" which firstly defines the maximum transmission rate of the noisy channel information, i.e., channel capacity. Meanwhile, Shannon also derived the limited transmission capability of the noisy channel, i.e., the minimum Signal-to-Noise Ratio required by errorless information transmission, which is also called as Shannon limit. The Shannon limit is an important indicator for evaluating the channel error correction capability. The closer the error correction performance curve to the Shannon limit, the more excellent is the error correction performance. Otherwise, farther to the Shannon limit, the worse is the performance.

The Low Density Parity Code (LDPC) is a kind of excellent channel error correction encoding scheme which may approach the Shannon limit. The LDPC code is a special linear parity check block code, whose parity check matrix is "sparse": there is only very few non-zero matrix elements (for the binary code, non-zero element is 1), and the remaining elements are all zero. In 1960, Robert Gallager firstly proposed the concept of LDPC code in his Ph.D. dissertation and also suggested two iterative decoding algorithms, thus the LDPC code is also called as Gallager code. Gallager indicated theoretically that the LDPC code may approach the channel capacity with lower complexity by using iterative decoding algorithms (or message delivering algorithms). This is a great invention, however, in the following 30 years researchers did not pay enough attention to the invention.

From the current viewpoint, one reasons why the LDPC code was ignored might consist in that the software and hardware levels of the computers were underdeveloped at that time, and thus the researches could not know the excellent performance of the LDPC code from results of computer simulations; as another reason, the LDPC code needs a larger storage space which could not be achieved at that time. Additionally, at that time, other codes such as Reed-Solomon code and Hamming code were available, which might be considered as temporarily usable channel encoding schemes, and thus the researchers did not intently forward their researches onto the LDPC code.

Even today, if it is intended to apply the LDPC code to actual communication systems, the LDPC code still needs to be carefully studied and designed. Since LDPC code has some special requirements when applying to actual communication systems, such as codec hardware schemes having lower complexity, excellent error correction performance, and the like, it is required to specially limit the construction of the parity check matrix of the LDPC code as well as deeply study on the encoding/decoding method. Generally, there are two methods of constructing the parity check matrix of the LDPC code: one is to firstly set some attribute limitations on the parity check matrix such as minimum girth or node degree distribution and then randomly or pseudo-randomly generate the parity check matrix by using the computer searching methods; the other is to construct the parity check matrix of the LDPC code by using the mathematical formulae to make it have regular structure.

Mobile digital multimedia broadcast communication system is developing rapidly in recent years, and a normal system thereof is termed as "Mobile TV" system. The most difficult part in the design of the mobile TV system lies in the miniaturization of the mobile phone and low power consumption design. Therefore, the technology adopted by the system normally has a high performance with low complexity, such as channel encoding technology.

The LDPC proposed in the present invention is a channel encoding scheme applicable to the mobile digital multimedia broadcast communication system.

SUMMARY OF INVENTION

As described above, an object of some embodiments of the present invention is to provide a method of constructing the LPDC code which can be applied to a mobile digital multimedia broadcast communication system having excellent error correction performance.

To this end, the present invention provide a method of using a processor to construct a LDPC code in a mobile digital multimedia broadcast communication system wherein a Low-Density Parity-Check matrix of the LPDC code is iteratively constructed according to a code table and an expansion method, and the code table is a part of the constructed Low-Density Parity-Check matrix, the method comprising the following steps:

step 1: using the processor to set up a first cycle with a cycling index I, the I falls in the range of 1 to row number or column number of the code table, wherein the maximum value of the I is the row number of the code table if the code table is a part of rows of the constructed Low-Density Parity-Check matrix, and the maximum value of the I is the column number of the code table if the code table is a part of columns of the constructed Low-Density Parity-Check matrix;

selecting data of $I^{th}$ row or $I^{th}$ column in the code table, if a representing format of the data sequence is not sparse, the data sequence is transformed into sparse format, and the data sequence in sparse format is marked by hexp and suppose the data sequence hexp comprises W data in total, in which the data of the $I^{th}$ row in the code table is selected if the code table is a part of rows of the constructed Low-Density Parity-Check matrix, and the data of the $I^{th}$ column in the code table is selected if the code table is a part of columns of the constructed Low-Density Parity-Check matrix;

step 2: using the processor to nest a second cycle with a cycle index J in the first cycle in which J is selected from the range of 1 to L;

wherein it is supposed that the dimension of the Low-Density Parity-Check matrix of the LPDC code is M rows and N columns, and the Low-Density rarity-Check matrix with M rows and N columns can be divided into m×n blocks with each block having L×L elements, i.e., M=m×L and N=n×L;

if the code table is a part of rows of the constructed Low-Density Parity-Check matrix and it is supposed that the data sequence hexp corresponds to the $r^{th}$ row of the Low-Density Parity-Check matrix with the r in the range of 1 to M, a variable "row" is calculated according to the following formula:

$$\text{row} = \{[(J-1) \times m + (r-I)] \% M\} + I,$$

in which the symbol % denotes modular operation, and the row falls in the range of 1 to M;

if the code table is a part of columns of the constructed Low-Density Parity-Check matrix and it is supposed that the data sequence hexp corresponds to the $c^{th}$ column of the Low-Density Parity-Check matrix with the c in the range of 1 to N, a variable "column" is calculated according to the following formula:

column={[(J−1)×n+(c−I)]% N}+I, in which % denotes modular operation, and the "column" falls in the range of 1 to N;

step 3: using the processor to nest a third cycle with a cycle index K in the variable "row" of the second cycle with the K in the range of 1 to W, and the $K^{th}$ data of the data sequence hexp is marked by hexp (K), and if the code table is a part of rows of the constructed Low-Density Parity-Check matrix, the hexp (K) falls in the range of 0 to N−1, and the variable "column" is calculated according to the following formula:

column=[(⌊hexp(K)/n⌋+J−1)%L]×n+(hexp(K)% n)+1, in which ⌊•⌋ denotes floor rounding operation;

if the code table is a part of columns of the constructed Low-Density Parity-Check matrix, the heap (K) falls in the range of 0 to M−1, and the variable "row" is calculated according to the following formula:

row=[(⌊hexp(K)/m⌋+J−1)% L]×m+(hexp(K)% m)+1, and setting the element at the $row^{th}$ row and $column^{th}$ column of the Low-Density Parity-Check matrix to be a non-zero element.

According to the above constructing method, the present invention can provide a LPDC code with excellent error correction performance which can be applied to a mobile digital multimedia broadcast communication system.

BRIEF DESCRIPTION OF DRAWINGS

The present invention is described but not limited in conjunction with the embodiments shown in the drawings throughout which the similar reference signs represent the similar elements, in which:

FIG. 1 is an error correction performance curve of a LDPC code in a mobile digital multimedia broadcast communication system according to the present invention.

DETAILED DESCRIPTION OF PREFERRED EMBODIMENTS

The present invention relates to a method of using a processor to construct a LDPC code in a mobile digital multimedia broadcast system. Mainly, a Low-Density Parity-Check matrix of the LPDC code is iteratively constructed according to a code table and an expansion method, and the code table is a part of the constructed Low-Density Parity-Check matrix. If the code table is a part of rows in the constructed Low-Density Parity-Check matrix, the method comprises the following steps:

step 1: using the processor to set up a first cycle with a cycling index I with the I falls in the range of 1 to row number of the code table, setting the data of the $I^{th}$ row of the code table to be a data sequence, if the representing format of the data sequence is not sparse, the data sequence is transformed into sparse format, and the data sequence represented in sparse format is denoted as hexp;

step 2: using the processor to nest a second cycle with a cycle index J in the first cycle in which J is selected from the range of 1 to L;

and it is supposed that the dimension of the Low-Density Parity-Check matrix of the LPDC code is M rows and N columns, and the Low-Density Parity-Check matrix with M rows and N columns can be divided into m×n blocks with each block having L×L elements, i.e., M=m×L and N=n×L;

and it is supposed that the data sequence hexp corresponds to the $r^{th}$ row of the Low-Density Parity-Check matrix with the r in the range of 1 to M, a variable "row" is calculated according to the following formula:

row={[(J−1)×m+(r−I)]% M}+1, in which the symbol % denotes modular operation, and the row falls in the range of 1 to M;

step 3: using the processor to nest a third cycle with a cycle index K in the variable "row" of the second cycle with the K in the range of 1 to W, and the $K^{th}$ data of the data sequence hexp is marked by hexp(K), and the hexp (K) falls in the range of 0 to N−1, and the variable "column" is calculated according to the following formula:

column=[(⌊hexp(K)/n⌋+j−1)% L]×n+(hexp(K)/% n)+1, in which ⌊•⌋ denotes floor rounding operation; and setting the element at the $row^{th}$ row and $column^{th}$ column of the Low-Density Parity-Check matrix to be a non-zero element. The code table can be sparse format, and it can also be non-sparse format. The sparse format means that only the specific positions of non-zero elements, i.e., row indexes and column indexes of the non-zero elements, in the Low-Density Parity-Check matrix are indicated, rather than the Low-Density Parity-Check matrix composed of zero elements and non-zero elements being specifically indicated; and the non-zero element denotes element "1" in the Low-Density Parity-Check matrix of binary LDPC code, the non-sparse format means the Low-Density Parity-Check matrix is represented by zero elements and non-zero elements.

The code table is composed of m rows of data, the code table having m rows of data can be composed of any cyclic continuous m rows of data in the constructed Low-Density Parity-Check matrix, and if row $m_1$ and row $m_2$ are cyclic continuous two rows in the Low-Density Parity-check matrix, then $|m_1−m_2|=1$ or $|m_1−m_2|=M−1$ in which |•| denotes absolute operation.

The code rates of the LDPC code in the embodiment are 1/2 and 3/4 with code length of 9216 bits, n=36, L=256, m equals 18 and 9 respectively, and the code table shown is the code table of the LDPC code with data of the first row to the $m^{th}$ row of the constructed Low-Density Parity-Check matrix and code rate of R=1/2:

| 0 | 6 | 12 | 18 | 25 | 30 |
|---|---|----|----|----|-----|
| 0 | 7 | 19 | 26 | 31 | 5664 |
| 0 | 8 | 13 | 20 | 32 | 8270 |
| 1 | 6 | 14 | 21 | 3085 | 8959 |
| 1 | 15 | 27 | 33 | 9128 | 9188 |
| 1 | 9 | 16 | 34 | 8485 | 9093 |
| 2 | 6 | 28 | 35 | 4156 | 7760 |
| 2 | 10 | 17 | 7335 | 7545 | 9138 |
| 2 | 11 | 22 | 5278 | 8728 | 8962 |
| 3 | 7 | 2510 | 4765 | 8637 | 8875 |
| 3 | 4653 | 4744 | 7541 | 9175 | 9198 |
| 3 | 23 | 2349 | 9012 | 9107 | 9168 |
| 4 | 7 | 29 | 5921 | 7774 | 8946 |
| 4 | 7224 | 8074 | 8339 | 8725 | 9212 |
| 4 | 4169 | 8650 | 8780 | 9023 | 9159 |
| 5 | 8 | 6638 | 8986 | 9064 | 9210 |
| 5 | 2107 | 7787 | 8655 | 9141 | 9171 |
| 5 | 24 | 5939 | 8507 | 8906 | 9173 |

The method of constructing the Parity-Check matrix is as follows:

```
for I=1:18
    selecting the I^th row of the above table denoting as
hexp;
    for J=1:256
        row =(J-1)*18+I;
        for K=1:6
            column [(⌊hexp(K)/36⌋+J-1)%256]*36+(hexp(K)%36)+1;
            the element of the row^th row and column^th column
in the Parity-Check matrix is a non-zero element;
        end
    end
end
```

The code table of the LDPC code with code rate of R=3/4 is as follows:

| 0 | 3  | 6    | 12   | 16   | 18   | 21   | 24   | 27   | 31   | 34   | 7494 |
|---|----|------|------|------|------|------|------|------|------|------|------|
| 0 | 4  | 10   | 13   | 25   | 28   | 5233 | 6498 | 7018 | 8358 | 8805 | 9211 |
| 0 | 7  | 11   | 19   | 22   | 6729 | 6831 | 7913 | 8944 | 9013 | 9133 | 9184 |
| 1 | 3  | 8    | 14   | 17   | 20   | 29   | 32   | 5000 | 5985 | 7189 | 7906 |
| 1 | 9  | 4612 | 5523 | 6456 | 7879 | 8487 | 8952 | 9081 | 9129 | 9164 | 9214 |
| 1 | 5  | 23   | 26   | 33   | 35   | 7135 | 8525 | 8983 | 9015 | 9048 | 9154 |
| 2 | 3  | 30   | 3652 | 4067 | 5123 | 7808 | 7838 | 8231 | 8474 | 8791 | 9162 |
| 2 | 35 | 3774 | 4310 | 6827 | 6917 | 8264 | 8416 | 8542 | 8834 | 9044 | 9089 |
| 2 | 15 | 631  | 1077 | 6256 | 7859 | 8069 | 8160 | 8657 | 8958 | 9094 | 9116 |

The method of constructing the Parity-Check matrix of the LDPC code with the code rate of R=3/4 is as follows:

```
for I=1:9
    selecting the I^th row of the above table denoting as
hexp;
    for J=1:256
        row =(J-1)*9+I;
        for K=1:12
            column=[(⌊hexp(K)/36⌋+J-1)%256]*36+(hexp(K)%36)+1;
            the element of the row^th row and column^th column
in the Parity-Check matrix is a non-zero element;
        end
    end
end
```

If the code table is a part of columns in the constructed Low-Density Parity-Check matrix, the method comprises the following steps:

step 1: using a processor to set up a first cycle with a cycling index I with the I falls in the range of 1 to column number of the code table, setting the data of the $I^{th}$ column of the code table to be a data sequence, if the representing format of the data sequence is not sparse, the data sequence is transformed into sparse format, and the data sequence represented in sparse format is denoted as heap;

step 2: using the processor to nest a second cycle with a cycling index J in the first cycle in which J is selected from the range of 1 to L;

and it is supposed that the dimension of the Low-Density Parity-Check matrix of the LPDC code is M rows and N columns, and the Low-Density Parity-Check matrix with M rows and N columns can be divided into m×n blocks with each block having L×L elements, i.e., M=m×L and N=n×L;

and it is supposed that the data sequence heap corresponds to the $c^{th}$ column of the Low-Density Parity-Check matrix with the c in the range of 1 to N, a variable "column" is calculated according to the following formula:

$$\text{column} = \{[(J-1) \times n + (c-I)] \% N\} + I,$$

in which the column falls in the range of 1 to N;

step 3: using the processor to nest a third cycle with a cycling index K in the variable "row" of the second cycle with the K in the range of 1 to W, and the $K^{th}$ data of the data sequence hexp is marked by hexp(K), and the hexp (X) falls in the range of 0 to M−1, and the variable "row" is calculated according to the following formula:

$$\text{row} = [(\lfloor \text{hexp}(K)/m \rfloor + J - 1) \% L] \times m + (\text{hexp}(K) \% m) + 1,$$

and setting the element at the $\text{row}^{th}$ row and $\text{column}^{th}$ column of the Low-Density Parity-Check matrix to be a non-zero element.

As described above, the code table may have a sparse format, and it can also have a non-sparse format with the same definition as described above. The code table can be composed of n columns of data, the n columns of data can be any cycling continuous n columns of data in the constructed Low-Density Parity-Check matrix, and if the column $n_1$ and $n_2$ are cycling continuous two columns in the Low-Density Parity-Check matrix, then $|n_1-n_2|=1$ or $|n_1-n_2|=N-1$ in which |•| denotes absolute operation. Similarly, the code rates of the LDPC code in the embodiment are 1/2 and 3/4 with code length of 9216 bits, n=36, L=256, m equals 18 and 9 respectively, the code table is the code table of the LDPC code with data of the first row to the $n^{th}$ column of the constructed Low-Density Parity-Check matrix and code rate of R=1/2:

| 0 | 3 | 6 | 9  | 12 | 15 | 0  | 1  | 2  | 5    | 7   | 8   | 0    | 2    | 3    | 4   | 5    |
|---|---|---|----|----|----|----|----|----|------|-----|-----|------|------|------|-----|------|
| (catenate the following) | | | | | | | | | | | | | | | | |
| 1 | 4 | 7 | 10 | 13 | 16 | 3  | 9  | 15 | 2296 | 302 | 377 | 119  | 265  | 179  | 50  | 260  |
| 2 | 5 | 8 | 11 | 14 | 17 | 6  | 12 | 22 | 3449 | 589 | 736 | 1783 | 2241 | 1311 | 304 | 2544 |
| (linking upwardly) | | | | | | | | | | | | | | | | |
| 7 | 0 | 1 | 2  | 3  | 8  | 11 | 17 | 0  | 1    |     |     |      |      |      |     |      |

| 0 | 3 | 6 | 9 | 12 | 15 | 0 | 1 | 2 | 5 | 7 | 8 | 0 | 2 | 3 | 4 | 5 |
|---|---|---|---|---|---|---|---|---|---|---|---|---|---|---|---|---|
| (catenate the following) | | | | | | | | | | | | | | | | |
| 856 | 28 | 189 | 58 | 77 | 141 | 122 | 47 | 383 | 488 | | | | | | | |
| 1668 | 156 | 3580 | 744 | 853 | 1988 | 463 | 1021 | 3081 | 3375 | | | | | | | |
| (linking upwardly) | | | | | | | | | | | | | | | | |
| 4 | 6 | 12 | 0 | 1 | 2 | 4 | 5 | 6 | | | | | | | | |
| 52 | 105 | 53 | 33 | 46 | 31 | 70 | 152 | 83 | | | | | | | | |
| 961 | 2260 | 2552 | 61 | 147 | 248 | 315 | 750 | 1673 | | | | | | | | |

The constructing method thereof is as follows:

```
for I=1:36
    selecting the I^th column of the above table denoting as
hexp;
    for J=1:256
        column =(J−1)*36+I;
        for K=1:3
            row=[(⌊hexp(K)/18⌋+J−1)%256)×18+(hexp(K)%18)+1;
            the element of the row^th row and column^th column
in the Parity-Check matrix is a non-zero element;
        end
    end
end
```

The code table of the LDPC code with code rate of R=3/4 is as follows:

| 0 | 3 | 6 | 0 | 1 | 5 | 0 | 2 | 3 | 4 | 1 |
|---|---|---|---|---|---|---|---|---|---|---|
| (catenate the following) | | | | | | | | | | |
| 1 | 4 | 7 | 3 | 11 | 296 | 217 | 114 | 35 | 40 | 23 |
| 2 | 5 | 8 | 6 | 1156 | 583 | 432 | 527 | 52 | 813 | 178 |
| (linking upwardly) | | | | | | | | | | |
| 2 | 0 | 1 | 3 | 8 | 0 | 3 | 0 | 2 | | |
| (catenate the following) | | | | | | | | | | |
| 350 | 50 | 56 | 106 | 59 | 74 | 43 | 24 | 68 | | |
| 1032 | 697 | 1000 | 195 | 931 | 1401 | 152 | 685 | 2159 | | |
| (linking upwardly) | | | | | | | | | | |
| 3 | 0 | 2 | 5 | 0 | 1 | 5 | 0 | 1 | 3 | |
| (catenate the following) | | | | | | | | | | |
| 22 | 31 | 44 | 258 | 76 | 29 | 357 | 193 | 214 | 185 | |
| 250 | 109 | 336 | 610 | 278 | 516 | 1240 | 605 | 755 | 335 | |
| (linking upwardly) | | | | | | | | | | |
| 6 | 0 | 3 | 5 | 0 | 5 | | | | | |
| 80 | 10 | 366 | 632 | 13 | 7 | | | | | |
| 1375 | 346 | 1065 | 2051 | 559 | 1302 | | | | | |

The constructing method thereof is as follows:

```
for I=1:36
    selecting the I^th column of the above table denoting as
hexp;
    for J=1:256
        column = ( J−1 )*36+I;
        for K=1:3
            row = [(⌊hexp(K)/9⌋+J−1)%256]×9+(hexp(K)%9)+1;
            the element of the row^th row and column^th column
in the Parity-Check matrix is a non-zero element;
        end
    end
end
```

Although the present invention is described in conjunction with the examples and embodiments, the present invention is not intended to be limited thereto. On the contrary, the present invention obviously covers the various modifications and may equivalences, which are all enclosed in the scope of the following claims.

What is claimed is:

1. A method of constructing a LDPC code in a mobile digital multimedia broadcast system using a processor, wherein a Low-Density Parity-Check matrix of the LPDC code is iteratively constructed according to a code table and an expansion method, and the code-table is a part of the constructed Low-Density Parity-Check matrix, the method comprising the following steps:

step 1: using the processor to set up a first cycle with a cycling index I with the I falls in the range of 1 to row number or column number of the code table, wherein the maximum value of the I is the row number of the code table if the code table is a part of rows of the constructed Low-Density Parity-Check matrix, and the maximum value of the I is the column number of the code table if the code table is a part of columns of the constructed Low-Density Parity-Check matrix;

selecting data of $I^{th}$ row or $I^{th}$ column in the code table, if a representing format of the data sequence is not sparse, the data sequence is transformed into sparse format, and the data sequence in sparse format is marked by hexp, in which the data of the $I^{th}$ row in the code table is selected if the code table is a part of rows of the constructed Low-Density Parity-Check matrix, and the data of the $I^{th}$ column in the code table is selected if the code table is a part of columns of the constructed Low-Density Parity-Check matrix;

step 2: using the processor to nest a second cycle with a cycling index J in the first cycle in which J is selected from the range of 1 to L;

wherein it is supposed that the dimension of the Low-Density Parity-Check matrix of the LPDC code is M rows and N columns, and the Low-Density Parity-Check matrix with M rows and N columns can be divided into m×n blocks with each block having L×L elements, i.e., M=m×L and N=n×L;

if the code table is a part of rows of the constructed Low-Density Parity-Check matrix and it is supposed that the data sequence hexp corresponds to the $r^{th}$ row of the Low-Density Parity-Check matrix with the r in the range of 1 to M, a variable "row" is calculated according to the following formula:

row={[(J−1)×m+(r−I)]% M}+I, in which the symbol % denotes modular operation, and the row falls in the range of 1 to M;

if the code table is a part of columns of the constructed Low-Density Parity-Check matrix and it is supposed that the data sequence hexp corresponds to the $c^{th}$ column of the Low-Density Parity-Check matrix with the c in the range of 1 to N, a variable "column" is calculated according to the following formula:

column={[(J−1)×n+(c−I)]% N}+I, in which % denotes modular operation, and the "column" falls in the range of 1 to N;

step 3: using the processor to nest a third cycle with a cycle index K in the variable "row" of the second cycle with the K in the range of 1 to W, and the $K^{th}$ data of the data sequence hexp is marked by hexp (K), and if the code table is a part of rows of the constructed Low-Density Parity-Check matrix, the hexp (K) falls in the range of 0 to N−1, and the variable "column" is calculated according to the following formula:

column=[(⌊hexp(K)/n⌋+J−1)% L]×n+(hexp(K)% n)+1, in which ⌊•⌋ denotes floor rounding operation;

if the code table is a part of columns of the constructed Low-Density Parity-Check matrix, the hexp (K) falls in the range of 0 to M−1, and the variable "row" is calcu-lated according to the following formula:

row=[(⌊hexp(K)/m⌋+J−1)% L]×m+(hexp(K)% m)+1, and setting the element at the $row^{th}$ row and $column^{th}$ column of the Low-Density Parity-Check matrix to be a non-zero element.

2. The method according to claim 1, wherein the code table can be composed of m rows of data, it can also be composed of n columns of data, and an identical Low-Density Parity-Check matrix can be generated according to the code table of m rows of data and the code table of n columns of data.

3. The method according to claim 1, wherein the code table can be a sparse format and it can also be a non-sparse format.

4. The method according to claim 3, wherein the sparse format means that only the specific positions of non-zero elements, i.e. row indexes and column indexes of the non-zero elements, in the Low-Density Parity-Check matrix are indicated, rather than a Low-Density Parity-Check matrix composed of zero elements and non-zero elements being specifically indicated; and the non-zero element denotes element "1" in the Low-Density Parity-Check matrix of binary LDPC code, the non-sparse format means the representing manner of the Low-Density Parity-Check matrix uses definite zero elements and non-zero elements.

5. The method according to claim 2, wherein the code table having m rows of data can be composed of any cyclic continuous m rows of data in the Low-Density Parity-Check matrix, and if row $m_1$ and row $m_2$ are cyclic continuous two rows in the Low-Density Parity-Check matrix, $|m_1-m_2|=1$ or $|m_1-m_2|=M-1$ in which |•| denotes absolute operation.

6. The method according to claim 5, wherein the code table is the data from the first row to $m^{th}$ row in the constructed Low-Density Parity-Check matrix.

7. The method according to claim 2, wherein the code table having n columns of data can be any cyclic continuous n columns of data in the constructed Low-Density Parity-Check matrix, and if the column $n_1$ and $n_2$ are cyclic continuous two columns in the Low-Density Parity-Check matrix, then $|n_1-n_2|=1$ or $|n_1-n_2|=N-1$ in which |•| denotes absolute operation.

8. The method according to claim 7, wherein the code table is the data from the first column to $n^{th}$ column in the constructed Low-Density Parity-Check matrix.

9. The method according to claim 6 or 8, wherein code rates of the LPDC code are 1/2 and 3/4, and code length thereof is 9216 bits, n=36, L=256, and m equals 18 and 9 respectively.

10. The method according to claim 9, wherein the code table of the LPDC code with a code rate of ½ represented in sparse format is as follows:

| 0 | 6 | 12 | 18 | 25 | 30 |
|---|---|---|---|---|---|
| 0 | 7 | 19 | 26 | 31 | 5664 |
| 0 | 8 | 13 | 20 | 32 | 8270 |
| 1 | 6 | 14 | 21 | 3085 | 8959 |
| 1 | 15 | 27 | 33 | 9128 | 9188 |
| 1 | 9 | 16 | 34 | 8485 | 9093 |
| 2 | 6 | 28 | 35 | 4156 | 7760 |
| 2 | 10 | 17 | 7335 | 7545 | 9138 |
| 2 | 11 | 22 | 5278 | 8728 | 8962 |
| 3 | 7 | 2510 | 4765 | 8637 | 8875 |
| 3 | 4653 | 4744 | 7541 | 9175 | 9198 |
| 3 | 23 | 2349 | 9012 | 9107 | 9168 |
| 4 | 7 | 29 | 5921 | 7774 | 8946 |
| 4 | 7224 | 8074 | 8339 | 8725 | 9212 |
| 4 | 4169 | 8650 | 8780 | 9023 | 9159 |
| 5 | 8 | 6638 | 8986 | 9064 | 9210 |
| 5 | 2107 | 7787 | 8655 | 9141 | 9171 |
| 5 | 24 | 5939 | 8507 | 8906 | 9173 | and the code table is a part of the rows in the constructed Low-Density Parity-Check matrix.

11. The method according to claim 9, wherein the code table of the LPDC code with a code rate of ¾ represented in sparse format is as follows:

| 0 | 3 | 6 | 12 | 16 | 18 | 21 | 24 | 27 | 31 | 34 | 7494 |
|---|---|---|---|---|---|---|---|---|---|---|---|
| 0 | 4 | 10 | 13 | 25 | 28 | 5233 | 6498 | 7018 | 8358 | 8805 | 9211 |
| 0 | 7 | 11 | 19 | 22 | 6729 | 6831 | 7913 | 8944 | 9013 | 9133 | 9184 |

-continued

| | | | | | | | | | | | |
|---|---|---|---|---|---|---|---|---|---|---|---|
| 1 | 3 | 8 | 14 | 17 | 20 | 29 | 32 | 5000 | 5985 | 7189 | 7906 |
| 1 | 9 | 4612 | 5523 | 6456 | 7879 | 8487 | 8952 | 9081 | 9129 | 9164 | 9214 |
| 1 | 5 | 23 | 26 | 33 | 35 | 7135 | 8525 | 8983 | 9015 | 9048 | 9154 |
| 2 | 3 | 30 | 3652 | 4067 | 5123 | 7808 | 7838 | 8231 | 8474 | 8791 | 9162 |
| 2 | 35 | 3774 | 4310 | 6827 | 6917 | 8264 | 8416 | 8542 | 8834 | 9044 | 9089 |
| 2 | 15 | 631 | 1077 | 6256 | 7859 | 8069 | 8160 | 8657 | 8958 | 9094 | 9116 | and the code table is a part of the rows in the constructed Low-Density Parity-Check matrix.

12. The method according to claim 9, wherein the code table of the LPDC code with a code rate of ½ represented in sparse format is as follows:

| 0 | 3 | 6 | 9 | 12 | 15 | 0 | 1 | 2 | 5 | 7 | 8 | 0 | 2 | 3 | 4 | 5 |
|---|---|---|---|---|---|---|---|---|---|---|---|---|---|---|---|---|
| | | | | | | (catenate the following) | | | | | | | | | | |
| 1 | 4 | 7 | 10 | 13 | 16 | 3 | 9 | 15 | 2296 | 302 | 377 | 119 | 265 | 179 | 50 | 260 |
| 2 | 5 | 8 | 11 | 14 | 17 | 6 | 12 | 22 | 3449 | 589 | 736 | 1783 | 2241 | 1311 | 304 | 2544 |
| | | | | | | (linking upwardly) | | | | | | | | | | |

| 7 | 0 | 1 | 2 | 3 | 8 | 11 | 17 | 0 | 1 |
|---|---|---|---|---|---|---|---|---|---|
| | | | | | | (catenate the following) | | | |
| 856 | 28 | 189 | 58 | 77 | 141 | 122 | 47 | 383 | 488 |
| 1668 | 156 | 3580 | 744 | 853 | 1988 | 463 | 1021 | 3081 | 3375 |
| | | | | | | (linking upwardly) | | | |

| 4 | 6 | 12 | 0 | 1 | 2 | 4 | 5 | 6 |
|---|---|---|---|---|---|---|---|---|
| 52 | 105 | 53 | 33 | 46 | 31 | 70 | 152 | 83 |
| 961 | 2260 | 2552 | 61 | 147 | 248 | 315 | 750 | 1673 | and the code table is a part of the columns in the constructed Low-Density Parity-Check matrix.

13. The method according to claim 9, wherein the code table of the LPDC code with a code rate of ¾ represented in sparse format is as follows:

| 0 | 3 | 6 | 0 | 1 | 5 | 0 | 2 | 3 | 4 | 1 |
|---|---|---|---|---|---|---|---|---|---|---|
| | | | | (catenate the following) | | | | | | |
| 1 | 4 | 7 | 3 | 11 | 296 | 217 | 114 | 35 | 40 | 23 |
| 2 | 5 | 8 | 6 | 1156 | 583 | 432 | 527 | 52 | 813 | 178 |
| | | | | (linking upwardly) | | | | | | |

| 2 | 0 | 1 | 3 | 8 | 0 | 3 | 0 | 2 |
|---|---|---|---|---|---|---|---|---|
| | | | | (catenate the following) | | | | |
| 350 | 50 | 56 | 106 | 59 | 74 | 43 | 24 | 68 |
| 1032 | 697 | 1000 | 195 | 931 | 1401 | 152 | 685 | 2159 |
| | | | | (linking upwardly) | | | | |

| 3 | 0 | 2 | 5 | 0 | 1 | 5 | 0 | 1 | 3 |
|---|---|---|---|---|---|---|---|---|---|
| | | | | (catenate the following) | | | | | |
| 22 | 31 | 44 | 258 | 76 | 29 | 357 | 193 | 214 | 185 |
| 250 | 109 | 336 | 610 | 278 | 516 | 1240 | 605 | 755 | 335 |
| | | | | (linking upwardly) | | | | | |

| 6 | 0 | 3 | 5 | 0 | 5 |
|---|---|---|---|---|---|
| 80 | 10 | 366 | 632 | 13 | 7 |
| 1375 | 346 | 1065 | 2051 | 559 | 1302 | and the code table is a part of the columns in the constructed Low-Density Parity-Check matrix.

* * * * *